United States Patent
Oklobdzija

(10) Patent No.: US 11,967,955 B2
(45) Date of Patent: Apr. 23, 2024

(54) FAST CLOCKED STORAGE ELEMENT

(71) Applicant: SambaNova Systems, Inc., Palo Alto, CA (US)

(72) Inventor: Vojin G. Oklobdzija, Palo Alto, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 18/096,515

(22) Filed: Jan. 12, 2023

(65) Prior Publication Data

US 2023/0155579 A1    May 18, 2023

Related U.S. Application Data

(63) Continuation of application No. 17/551,610, filed on Dec. 15, 2021, now Pat. No. 11,558,041.

(60) Provisional application No. 63/230,782, filed on Aug. 8, 2021.

(51) Int. Cl.
*H03K 3/037*    (2006.01)
*H03K 3/012*    (2006.01)

(52) U.S. Cl.
CPC .......... *H03K 3/0372* (2013.01); *H03K 3/012* (2013.01)

(58) Field of Classification Search
CPC ... H03K 3/0372; H03K 3/012; H03K 3/35625
See application file for complete search history.

(56) References Cited

U.S. PATENT DOCUMENTS

| | | | | |
|---|---|---|---|---|
| 6,369,629 B1 * | 4/2002 | Sato | ............. | H03K 3/35625 |
| | | | | 327/212 |
| 6,538,471 B1 * | 3/2003 | Stan | ............. | H03K 3/35625 |
| | | | | 326/46 |
| 6,895,061 B1 * | 5/2005 | Stong | ............. | H03K 3/0372 |
| | | | | 327/202 |
| 9,941,881 B1 * | 4/2018 | Jung | ............. | H03K 3/012 |
| 10,720,909 B2 * | 7/2020 | Kim | ............. | H03K 23/001 |
| 11,050,423 B1 | 6/2021 | Gruber et al. | | |
| 11,552,622 B1 | 1/2023 | Pham et al. | | |
| 2009/0251185 A1 | 10/2009 | Wu et al. | | |

(Continued)

FOREIGN PATENT DOCUMENTS

WO    2010142987 A1    12/2010

OTHER PUBLICATIONS

Anonymous, Sequential Logic Circuits and Flip-flops, retrieved on Mar. 22, 2022, 32 pages. Retrieved from the internet [URL: https://www.electronics-tutorials.ws/sequential/seq_1.html ].

(Continued)

*Primary Examiner* — Sibin Chen
(74) *Attorney, Agent, or Firm* — Flagship Patents; Sikander M. Khan; Bruce A. Young

(57) ABSTRACT

A clocked storage element comprises a first latch having an input data node, a clock input node and a first latch output data node, and a second latch having an input connected to the first latch output data node, a clock input node and a second latch output data node. The first and second latches can have a clocked pull-up current path consisting of two p-channel transistors between their respective output data nodes and the VDD supply line, and a clocked pull-down current path consisting of two n-channel transistors between their respective output data nodes and the VSS supply line.

20 Claims, 6 Drawing Sheets

(56) References Cited

U.S. PATENT DOCUMENTS

| | | |
|---|---|---|
| 2013/0234753 A1 | 9/2013 | Chandrasekharan et al. |
| 2013/0261815 A1 | 10/2013 | Suzuki et al. |
| 2015/0263706 A1 | 9/2015 | Nakayama |
| 2016/0098506 A1 | 4/2016 | Agarwal et al. |
| 2018/0123571 A1 | 5/2018 | Savanth et al. |
| 2022/0190813 A1* | 6/2022 | Rao ................ H03K 19/018521 |

OTHER PUBLICATIONS

Devlin et al., BERT: Pre-training of Deep Bidirectional Transformers for Language Understanding, dated May 24, 2019, 16 pages.

Koeplinger et al., Spatial: A Language and Compiler for Application Accelerators, PLDI '18, Jun. 18-22, 2018, Association for Computng Machinery, 16 pages.

M. Emani et al., Accelerating Scientific Applications With Sambanova Reconfigurable Dataflow Architecture, in Computing in Science & Engineering, vol. 23, No. 2, pp. 114-119, Mar. 26, 2021, [doi: 10.1109/MCSE.2021.3057203].

Podobas et al, A Survey on Coarse-Grained Reconfigurable Architectures From a Performance Perspective, IEEEAccess, vol. 2020. 3012084, Jul. 27, 2020, 25 pages.

Prabhakar et al., Plasticine: A Reconfigurable Architecture for Parallel Patterns, ISCA, Jun. 24-28, 2017, 14 pages.

Saleh, Lecture-6 Flip-Flop and Clock Design, Depailment of ECE, University of British Columbia, 16 pages.

U.S. Appl. No. 17/702,295—Notice of Allowance dated Jun. 8, 2022, 14 pages.

Vaswani et al., Attention is All You Need, Advances in Neural Information Processing Systems 2017, dated Dec. 6, 2017, 15 pages.

* cited by examiner

FAST CLOCKED STORAGE ELEMENT

PRIORITY APPLICATION

This application is a continuation of U.S. patent application Ser. No. 17/551,610, now U.S. Pat. No. 11,558,041 B2, filed on 15 Dec. 2021, which claims the benefit of U.S. Provisional Patent Application No. 63/230,782 filed 8 Aug. 2021; both of the aforementioned applications are incorporated by reference herein for any and all purposes.

BACKGROUND

This disclosure describes a clocked storage element, sometimes referred to as "flip-flop", used for temporarily storing information in digital systems. Clocked storage elements are essential in constructing the Finite-State Machine (FSM) which is the core of every digital system. A few important characteristics of the clocked storage element include low "insertion delay" (Data-to-Q delay), low power consumption and small footprint (area).

Clocked storage elements are very important elements in a digital system. They may take up to 20% of the clock cycle from the useful time allotted for computation. In addition, they may contribute to a quarter of the power consumed in the digital system, in dynamic power and more in the static power. The area taken by clocked storage elements similarly contributes to the total chip area, where chip area is directly proportional to the cost, performance, power, and the total amount of functionality that the chip can provide. Thus, there has been a continuous effort to design clocked storage elements which are: smaller, faster and less power consuming.

SUMMARY

A technology is described for implementation of clocked storage elements that according to various aspects, are compact and fast, and allow for flexible layouts and configurations. Embodiments are described having an insertion delay less than 50 picoseconds, and less than 40 picoseconds.

According one aspect of the technology, a clocked storage element comprises a first latch having an input data node, a clock input node and a first latch output data node, the first latch having a current path consisting of two p-channel transistors between the first latch output data node and a VDD supply line, and two n-channel transistors between the first latch output data node and a VSS supply line; and a second latch having an input connected to the first latch output data node, a clock input node and a second latch output data node, the second latch having a current path consisting of, two n-channel transistors between the first latch output data node and a VSS supply line, and two p-channel transistors between the second latch output data node and the VDD supply line.

According another aspect of the technology embodiment, a clocked storage element comprises a first latch having an input data node, a clock input node and a first latch output data node; and a second latch having an input connected to the first latch output data node, a clock input node and a second latch output data node, wherein a critical timing path from the input data node of the first latch to the second latch output data node has only two transistor path delays, and two transistors in the path of the first latch output to the second latch data node The total delay between the input data node to the second latch output no greater than four signal passes, including a signal pass through two p-channel transistors to pull up the latch output data node of one of the first and second latches, and a signal pass through two n-channel transistors to pull down the latch output data node of the other of the first and second latches.

According to another aspect of the technology embodiment, a clocked storage element comprising of a first latch and a second latch does not require the clock input to be inverted. That is, the first latch and second latch have respective clock input nodes which receive the clock signal with the same polarity. One advantage of this feature arises in connection with insertion delay, because a margin to account for the settlement of signals on the output of a clock inverter otherwise required to drive one of the latches, is not involved.

Also, described is an integrated circuit having a rising edge clocked storage element having a master latch with a first circuit configuration (e.g., a merged OR-NAND configured transistor stack and a NAND transistor stack configured as feedback) and a slave latch with a second circuit configuration (e.g., a merged OR-NAND configured transistor stack and a NAND transistor stack configured as feedback), and a negative edge clocked storage element having a master latch with the second circuit configuration and a slave latch with a first circuit configuration.

Other aspects and advantages of the present technology can be seen on review of the drawings, the detailed description and the claims, which follow.

DETAILED DESCRIPTION

A detailed description of embodiments of the technology is provided with reference to FIGS. 1 to 8.

Figure 1:
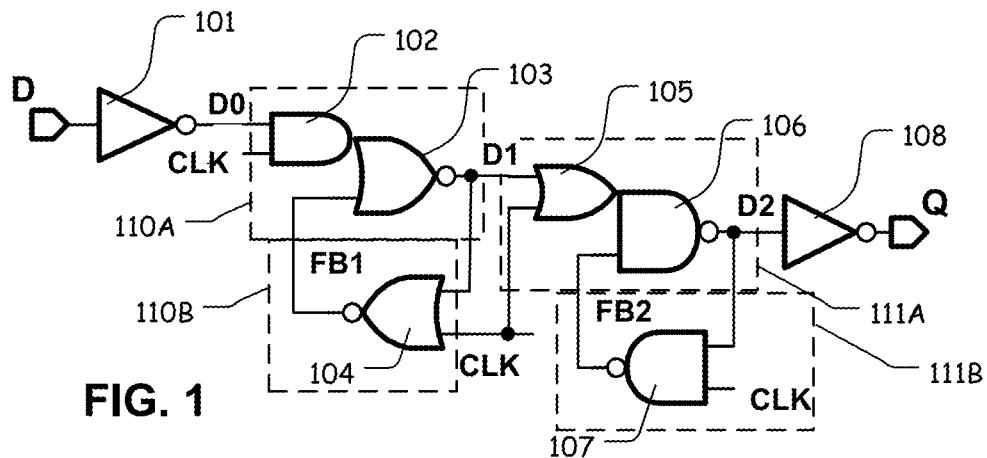
FIG. 1 illustrates a Master-Slave latch constructed by combining the two individual latches, with inverters added at the input and the output.

FIG. 1 is a logic diagram of a clocked storage element. In the illustrated example, the clocked storage element, configured as a falling-edge triggered flip-flop, has a buffered input receiving a data signal D and a buffered output producing an output signal Q. In this example, the data signal D is applied to the input of an inverter 101 acting as a buffer. The output of the inverter 101 is a data signal D0 which can be considered the input of a first latch in the clocked storage element.

The first latch is implemented using a first circuit configuration, which includes a first transistor stack 110A and a second transistor stack 110B. The first transistor stack 110A implements a merged AND-NOR gate 102, 103 and generates a first latch output data signal D1 at a first latch output data node. The second transistor stack 110B implements a NOR gate 104, which generates a first feedback signal FB1.

The inputs to the merged AND-NOR gate 102, 103 include the data signal D0 and a clock signal CLK logically as inputs to the AND function. The output of the AND function is logically applied as input to the NOR function. The first feedback signal FB1 is applied logically as input to the NOR function. The inputs to the NOR gate 104 in the second transistor stack include the first latch output data signal D1 and the clock signal CLK.

The second latch is implemented using a second circuit configuration, which includes a third transistor stack 111A and a fourth transistor stack 111B. The third transistor stack 111A implements a merged OR-NAND gate 105, 106 and generates a data output signal D2 at a second latch output data node, which is applied as an input to inverter 108. The output of the inverter 108 is the buffered output signal Q. The fourth transistor stack 111B implements a NAND gate 107 which generates a second feedback signal FB2.

The inputs to the merged OR-NAND gate 105, 106 include the first latch output data signal D1 and the clock signal CLK logically as inputs to the OR function, the output of which is logically applied as input to the NAND function. The second feedback signal FB2 is also logically applied as an input to the NAND function. The inputs to the NAND gate 107 in the fourth transistor stack include the output data signal D2 and the clock signal CLK.

As seen, the critical timing path between the input signal D0 and the output data signal D2 traverses only two transistor stacks 110A, 111A. As a result, a critical timing path can established using techniques described herein that has only four transistor delays from D data input to Q output, one in each stack, during some conditions.

Also, embodiments as described herein implement the transistor stack 110A of the AND-NOR gate such that it includes a clocked pull-up current path consisting of two p-channel transistors between the first latch output data node (signal D1) and a VDD supply line, and a pull-down current path consisting of two n-channel transistors between the first latch output data node and VSS supply line. Also, embodiments described herein implement the transistor stack 111A of the OR-NAND gate such that it includes a clocked pull-up current path consisting of two p-channel transistors between the first latch output data node (signal D2) and a VDD supply line, and a pull-down current path consisting of two n-channel transistors between the first latch output data node (signal D2) and VSS supply line Also, embodiments are described in which the two p-channel transistors in the clocked pull-up current path of the first latch and the two p-channel transistors in the clocked pull-up current path of the second latch have channel lengths of about 7 nm or less, manufacturable for example using so-called 7 nanometer or 5 nanometer nodes.

The embodiment of FIG. 1 implements a clocked storage element which triggers the transition of the output data signal D2 on the negative, or falling, edge of the clock signal CLK.

To implement a clocked storage element configured as a falling-edge triggered flip-flop, from the embodiment of FIG. 1, an inverse/CLK of the clock signal CLK can be applied instead. In either case, the polarity of CLK signal applied on the latch clock input nodes of the first and second latches is the same.

Figure 2:
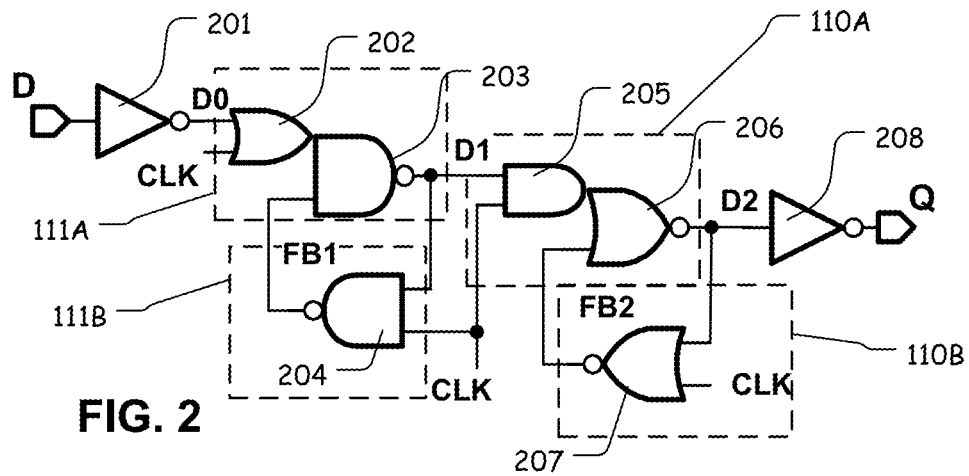
FIG. 2 illustrates "rising edge" Master-Slave latch constructed by swapping the "master" and "slave" latches of the FIG. 1.

The embodiment of FIG. 2 implements a clocked storage element, configured as a rising-edge triggered flip-flop, which triggers the transition of the output data signal D2 on the rising edge of the clock signal CLK, without an added clock signal inverter.

In the illustrated example shown in FIG. 1, the clocked storage element has a buffered input receiving a data signal D and a buffered output producing an output signal Q. So in this example shown in FIG. 2, the data signal D is applied to the input of an inverter 201 acting as a buffer. The output of the inverter 201 is a data signal D0 which can be considered the input of the first latch. The output Q is produced by an inverter 208 connected to the D2 signal of the second latch. The D2 signal can be considered the output of the second latch.

The first latch has the second circuit configuration as described with reference to FIG. 1, including the third transistor stack 111A that implements a merged OR-NAND gate 202, 203 and generates a first latch output data signal D1 at a first latch output data node. The first latch in this embodiment includes the fourth transistor stack 111B which implements a NAND gate 204 which generates a first feedback signal FB1.

The inputs to the merged OR-NAND gate 202, 203 include the data signal D0 and a clock signal CLK applied logically as inputs to the OR function. The output of the OR function is applied logically as input to the NAND function. The first feedback signal FB1 is applied logically as input to the NAND function. The inputs to the NAND gate 204 in the second transistor stack include the first latch output data signal D1 and the clock signal CLK.

The second latch is implemented using the first circuit configuration as described above, including the first transistor stack 110A and the second transistor stack 110B. The first transistor stack 110A implements a merged AND-NOR gate 205, 206 and generates a data output signal D2 at a second latch output data node, which is applied as an input to inverter 208. The output of the inverter 208 is the buffered output signal Q. The second transistor stack 110B implements a NOR gate 207 which generates a second feedback signal FB2.

The inputs to the merged AND-NOR gate 205, 206 include the first latch data signal D1 and the clock signal CLK applied logically as inputs to the AND function, the output of which is applied logically as input to the NOR function. The second feedback signal FB2 is also applied logically as an input to the NOR function. The inputs to the NOR gate 207 in the fourth transistor stack include the output data signal D2 and the clock signal CLK.

As seen in this example as well, a critical timing path between the input signal D0 and the output data signal D2 traverses only two transistor stacks. As a result, a critical timing path, from data to output traverses only four transistor gate delays.

Also, embodiments as described herein implement the transistor stack forming the OR-NAND gate 202, 203 such that it includes a clocked pull-up current path consisting of two p-channel transistors between the first latch output data node (signal D1) and a VDD supply line, and a clocked pull-down current path consisting of two n-channel transistors between the first latch output data node (signal D1) and VSS supply line. Also, embodiments described herein implement the transistor stack forming the AND-NOR gate 205, 206 such that it includes a clocked pull-up current path consisting of two p-channel transistors between the output data node (signal D2) and a VDD supply line, and a clocked pull-down current path consisting of two n-channel transistors between the first latch output data (signal D2) node and VSS supply line.

As with the embodiment of FIG. 1, embodiments are described in which the two p-channel transistors in the clocked pull-up current path of the first latch and the two p-channel transistors in the clocked pull-up current path of the second latch have channel lengths of about 7 nm or less.

Figure 3:
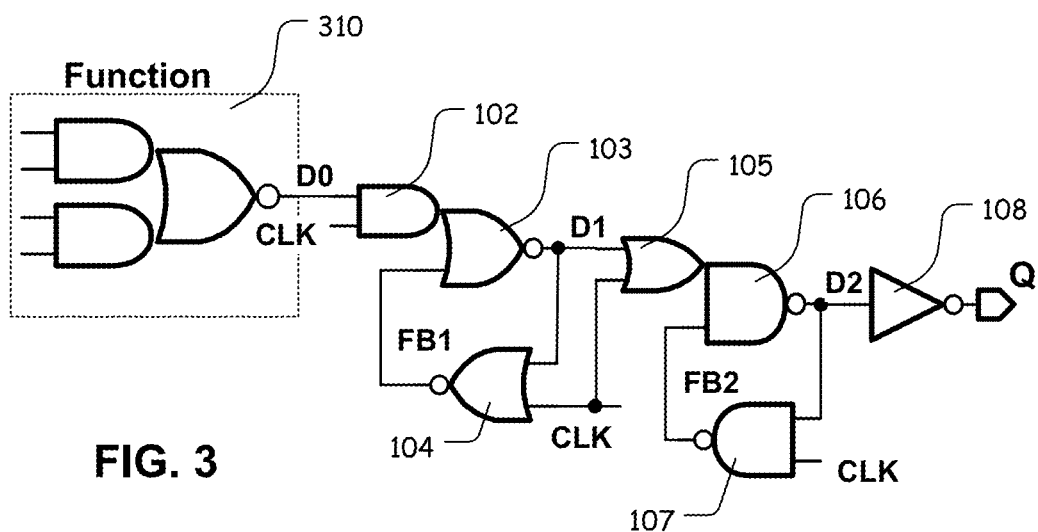
FIG. 3 illustrates a Master-Slave latch like that of FIG. 1, where the input inverter is being replaced by an arbitrary function.

In the embodiments described with respect to FIG. 1 and FIG. 2, the input data signal D is applied through inverters 101, 102 as input data signal D0. In other embodiments, other functional circuits can be utilized instead of the inverters, as illustrated schematically in FIG. 3. The circuit shown in FIG. 3 is the same as that as FIG. 1, except that the inverter 101 is replaced with a functional block 310. The same reference numerals are applied in FIG. 3 as in FIG. 1 for like elements. The functional element 310 shown in FIG. 3 is a combination of a NAND and NOR gates. This is a schematic representation of any variety of combinational logic or other kind of electronic circuit, that can be used to drive signal D0 to be captured by the clocked storage element. Also, in other embodiments, the buffered output signal Q can be driven by circuitry other than the inverter 108 illustrated.

Figure 4:
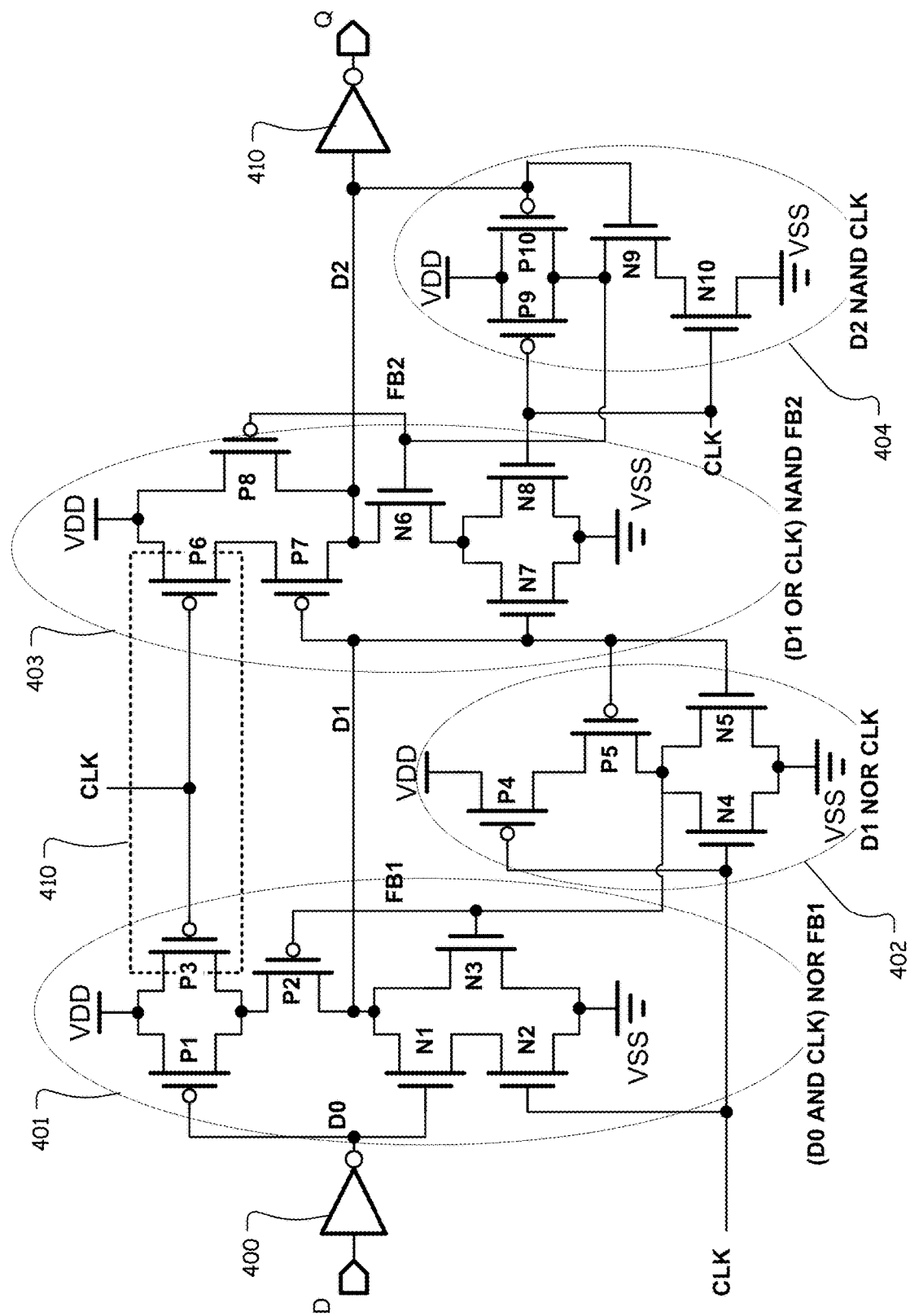
FIG. 4 illustrates transistor schematic diagram of the falling-edge M-S latch of FIG. 1.

FIG. 4 is a transistor schematic diagram of a clocked storage element like that of FIG. 1. In this example, the input D is applied through inverter 400 to the input data node for signal D0 (first stack input data node). Also, the output Q is driven by the output inverter 410, which receives as input the second latch output data signal D2 (second stack output data node). Other types of circuitry can be used to buffer the inputs and outputs of the clocked storage element of FIG. 4.

The embodiment shown in FIG. 4 includes a first transistor stack 401 (like 110A), a second transistor stack 402 (like 110B), a third transistor stack 403 (like 111A) and a fourth transistor stack 404 (like 111B). A transistor stack as the term is used herein includes a pull-up circuit path between a VDD supply line and an output data node, and a pull-down circuit path between the same output data node and a VSS supply line.

The first transistor stack 401 includes a first p-channel transistor P1 and a second p-channel transistor P2 connected in series between a VDD supply line and a first latch output data node (signal D1), a first n-channel transistor N1 and a second n-channel transistor N2 connected in series between the first latch output data node (signal D1) and a VSS supply line, a third p-channel transistor P3 connected in parallel with the first p-channel transistor P1 and a third n-channel transistor N3 connected in parallel with the first and second n-channel transistors N1, N2. The first p-channel transistor P1 and first n-channel transistor N1 have gates connected to a data input node (signal D0), and the third p-channel transistor P3 and the second n-channel transistor N2 have gates connect to a clock input node CLK.

The pull-up circuit in the stack 401 includes two current paths, P2-P3 and P2-P1. These current paths each consist of only two p-channel transistors. The pull-down circuit in the stack 401 includes two current paths, N1-N2 and N3. The N1-N2 current path is the longest current path and consists of only two n-channel transistors.

In the illustrated embodiment, the first transistor stack 401 implements a function (D0 AND CLK) NOR FB1, as illustrated in FIG. 1.

The second transistor stack 402 includes a fourth p-channel transistor P4 and a fifth p-channel transistor P5 connected in series between the VDD supply line and a first stack feedback node (signal FB1), and a fourth n-channel transistor N4 and a fifth n-channel transistor N5 connected in parallel between the first stack feedback node (signal FB1) and the VSS supply line. The fourth p-channel transistor P4 and the fourth n-channel transistor N4 have gates connected to the clock input node CLK, the fifth p-channel transistor P5 and the fifth n-channel transistor N5 have gates connected to the first latch output data node (signal D1). The second p-channel transistor P2 and the third n-channel transistor N3 in the first stack 401 have gates connected to the first stack feedback node FB1.

In the illustrated embodiment, the second transistor stack 402 implements a function (D1 NOR CLK), as illustrated in FIG. 1.

The third transistor stack 403 includes a sixth p-channel transistor P6 and a seventh p-channel transistor P7 connected in series between a VDD power supply line and a data output node (signal D2) (D2 is also a third stack data output node), a sixth n-channel transistor N6 and a seventh n-channel transistor N7 connected between the data output node and a VSS supply line. An eighth p-channel transistor P8 is connected in parallel with the sixth and seventh p-channel transistors P6, P7. An eighth n-channel transistor N8 is connected in parallel with the seventh n-channel transistor N7. The seventh p-channel transistor P7 and seventh n-channel transistor N7 have gates connected to the first stack output data node (signal D1). The sixth p-channel transistor P6 and the eighth n-channel transistor N8 have gates connect to the clock input node.

The pull-up circuit in the stack 403 includes two current paths, P7-P6 and P8. The P7-P6 current path is the longest current path and consists of only two p-channel transistors. The pull-down circuit in the stack 401 includes two current paths, N6-N7 and N6-N8. These current paths each consist of only two n-channel transistors.

In the illustrated embodiment, the third transistor stack 403 implements a function (D1 OR CLK) NAND FB2, as illustrated in FIG. 1.

The fourth transistor stack 404 includes a ninth p-channel transistor P9 and a tenth p-channel transistor P10 connected in parallel between a VDD power supply line and a third stack feedback node (signal FB2). Also, the fourth transistor stack 404 includes a ninth n-channel transistor N9 and a tenth n-channel transistor N10 connected in series between the third stack feedback node (signal FB2) and the VSS supply line. The ninth p-channel transistor P9 and the tenth n-channel transistor N10 have gates connect to the clock input node CLK, and the tenth p-channel transistor P10 and the ninth n-channel transistor N9 have gates connect to the data output node (signal D2).

In the illustrated embodiment, the fourth transistor stack 404 implements a function (D2 NAND CLK), as illustrated in FIG. 1.

The circuit illustrated in FIG. 4, excluding the input buffer 401 and the output buffer 410, consists of 20 CMOS transistors. In one embodiment, the third p-channel transistor P3 in the first transistor stack 401, and the sixth p-channel transistor P6 in the third transistor stack 403 are combined and implemented as a single transistor (represented by box 410). As a result, the circuit shown in FIG. 4 can be implemented in an embodiment consisting of 19 CMOS transistors.

In order for the data D0 to be captured in the first (Master) latch, the clock signal CLK has to be CLK=1. That means that the Master latch will be "transparent", i.e. any change of D0 will be reflected on the node D1 (D1 will take the opposite value of D0). When the clock signal turns to CLK=0, data on the line D0 will be "captured" in the Master latch, as the circuit 402, as well as 401 turns into an inverter keeping the value on D1 line in the loop. However, for the "capture" to be reliable, data on D0 cannot change in the same time the clock transitions from 1-to-0, and should be held stable ("frozen") at least for some time ("setup time" U) before the clock signal changes. This time U is designated as a "setup time" designating the last moment data D0 can change before the clock transition from 1-to-0 ("falling edge" of the clock).

When the clock transitions from 1-to-0, the circuit 403 will pass the change on D1 line to D2. The time for this change to propagate to D2 will be the time from the clock transition 1-to-0 to the time D2 changes its value. This is designated as CLK-to-Q delay, $t_{ClkQ}$ (as D2 is representing the Q signals when input and output inverters are removed).

The portion of the delay a signal travels through the latch (designated as "insertion delay") is the sum of the setup time U and CLK-to-Q delay, i.e. this is the time from the latest allowed change on the input data D to the change of the output Q and is designated as DQ delay ($t_{DQ}$), or insertion delay.

Figure 7:
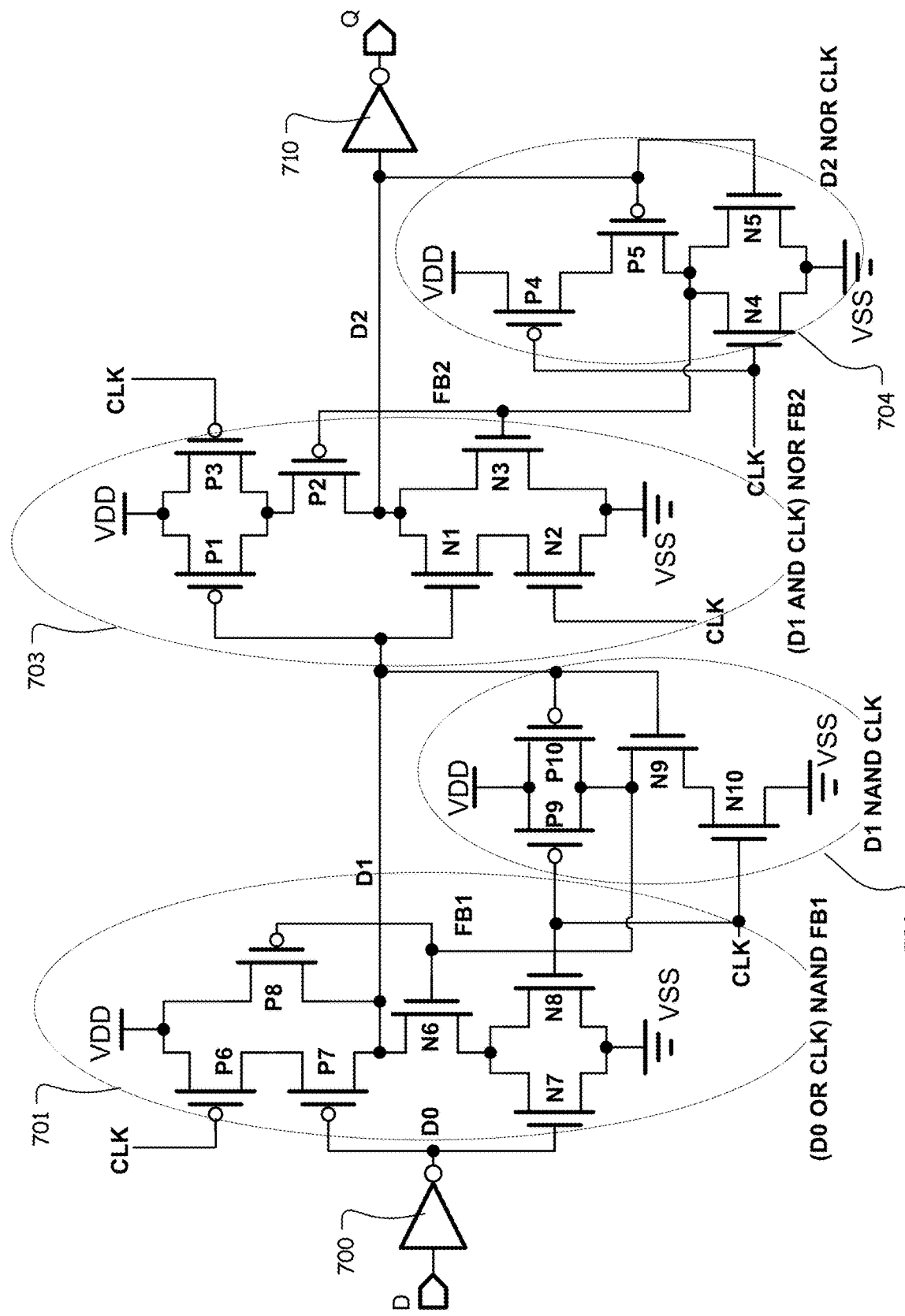
FIG. 7 illustrates transistor schematic diagram of the rising-edge M-S latch of FIG. 2.

To properly measure D-to-Q delay $t_{DQ}$, we must bring the change on the data line D closer and closer to the "falling edge" of the clock CLK till the output Q fails to capture the proper value of D. This "signal sweep" is shown in FIG. 7 and the value of $t_{DQ}$ determined to be about 31 pS for the particular simulation using 5 nm technology.

Figure 5:
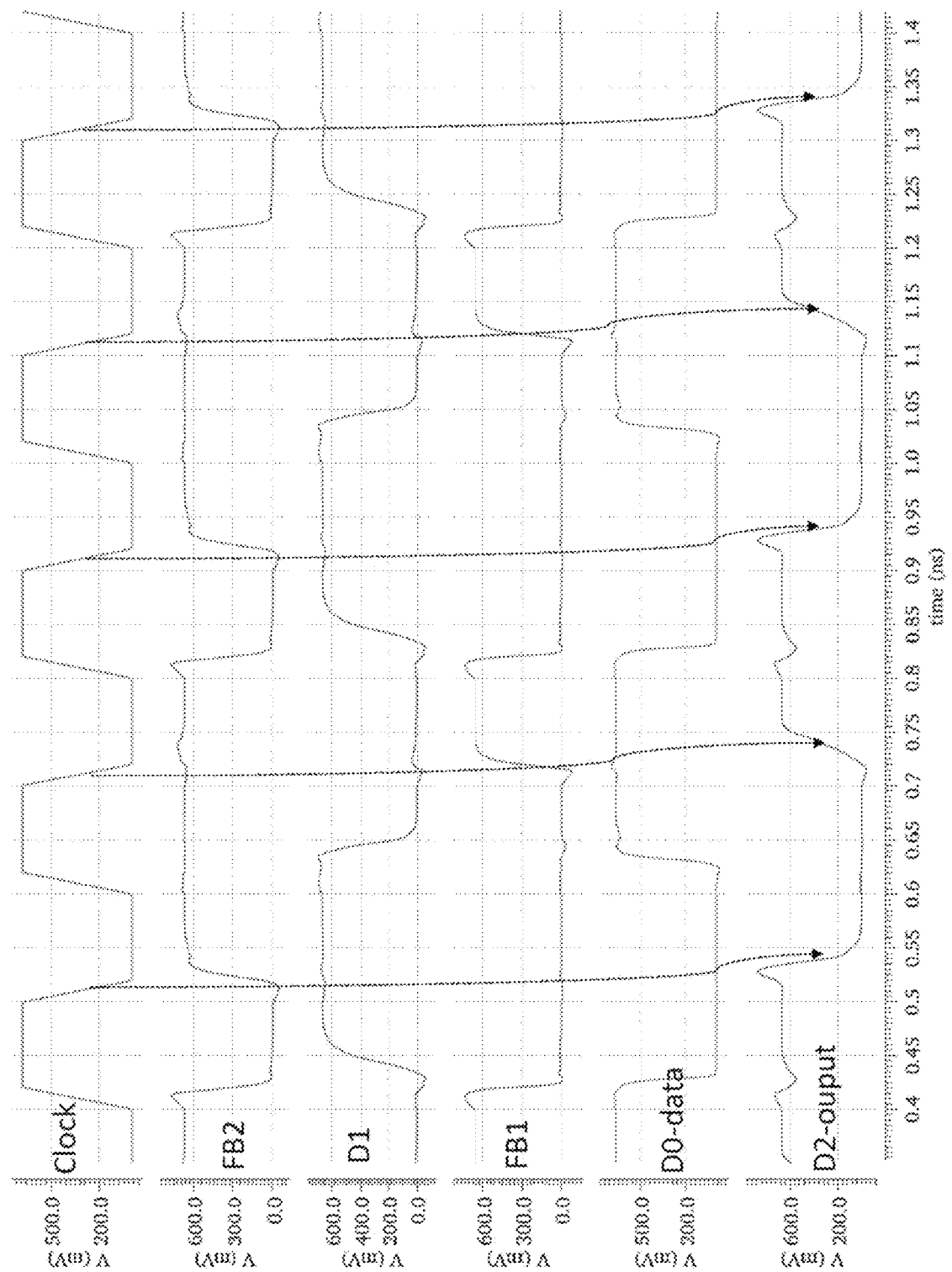
FIG. 5 is timing diagram for operation of the circuit of FIG. 4.

FIG. 5 is a timing diagram based on simulation illustrating operation of the circuit of FIG. 4 for a condition in which the input data signal D0 transitions from high to low while the clock signal CLK is high. It is noted that the first latch in the circuit of FIG. 4 is transparent while the clock is high but generates an inverted output D1. Also, the second latch in the circuit of FIG. 4 is transparent while the clock is low, generating the clocked output D2 on the falling edge of the clock signal CLK.

In FIG. 5, the signal names are shown on the left, and match the corresponding signal names shown in FIG. 4.

Referring to FIG. 5, at initialization, when the clock signal CLK starts cycling, assuming D0 is high, the internal data signal D1 falls or is set low on the first rising edge of the clock signal CLK because transistors N1 and N2 turn on while transistors P1 and P3 turn off. While D1 remains low, the first feedback signal FB1 is an inverse of the clock signal CLK, controlled by the clock signal CLK on the gates of transistors P4 and N4. So, after the next falling edge of the clock signal CLK, D1 is held low while D0 is high by the feedback signal FB1 on the gate of transistor N3, because the feedback signal FB1 is held high by the low clock CLK on the gate of transistor P4 and low D1 on the gate of transistor P5.

While D1 is low, the signal D2 transitions high on the falling edge of the clock signal CLK via transistors P6 and P7, capturing the data signal D0. The second feedback signal FB2 follows the inverse of the clock signal CLK while D2 is high turning on transistor N9, as a result of transistors P9 and N10.

As illustrated, if the signal D0 transitions from high to low while the clock signal CLK is low, the first latch output data signal D1 transitions high on the next rising edge of the clock signal CLK. This causes the first feedback signal FB1 to go low and remain low as long as D1 is high, as result of transistor N5.

The output data signal D2 remains high until the next falling edge of the clock signal CLK, because the second feedback signal FB2 is low. When the second feedback signal FB2 transitions high turning on transistor N6 and N7, the data signal D2 transitions low, capturing the input data signal D0. When the data signal D2 is low, the second feedback signal FB2 is held high.

Figure 6:
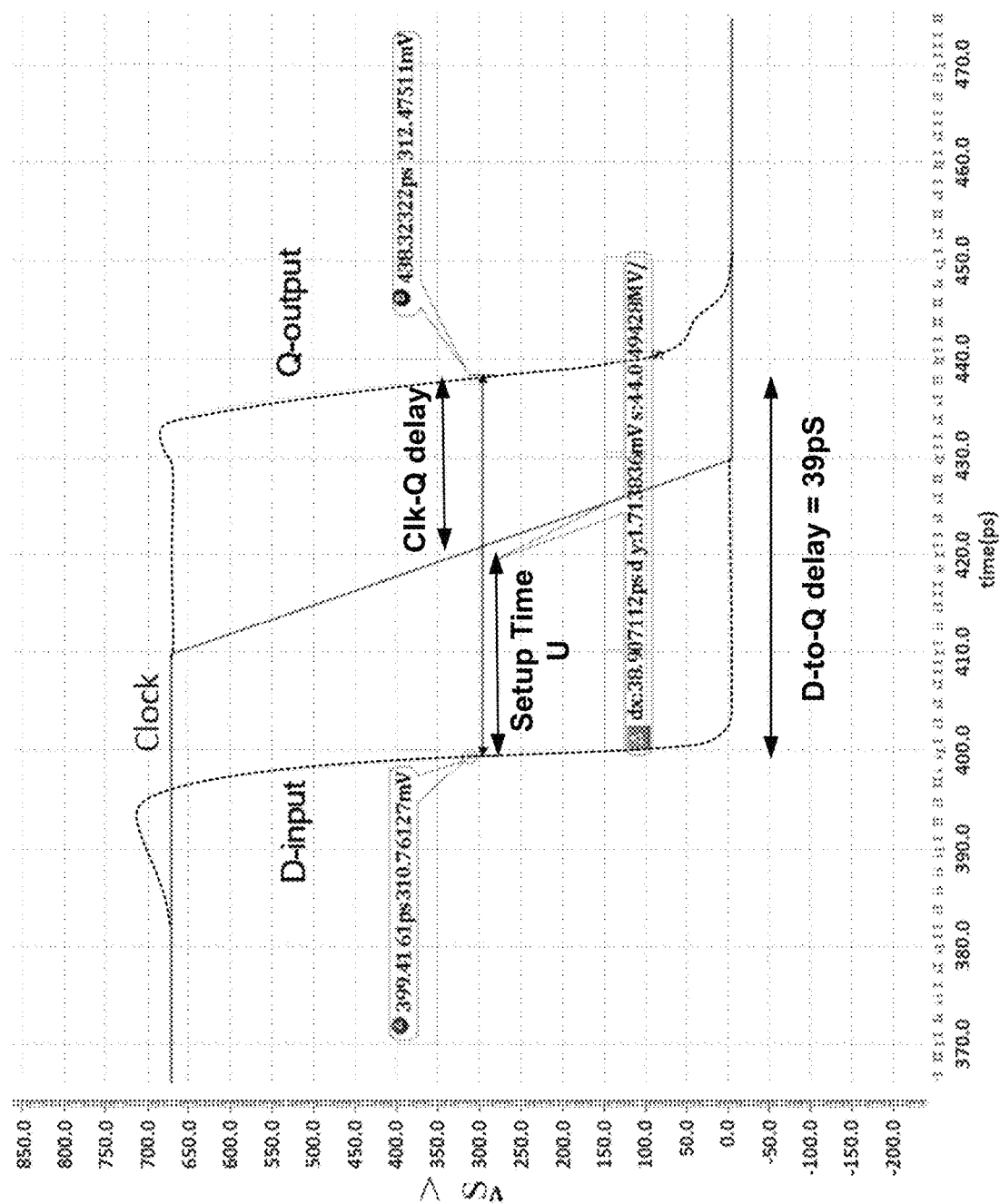
FIG. 6 is timing diagram showing D to Q delay (insertion delay) of the circuit of FIG. 4.

FIG. 6 illustrates simulation result for the circuit of FIG. 4. The functionality of the circuit of FIG. 4 is demonstrated by running it on the HSPICE circuit simulator utilizing 5 nm technology node transistor parameters under the worse environmental conditions and extracted parasitic parameters from the technology. The insertion delay of the clocked storage element, D-to-Q, is determined by changing the data signal D closer to the falling edge of the clock until the output Q fails. The last stable D-Q transition simulated shows D-to-Q delay $t_{DQ}$ equal to about 39 pS. Thus embodiments of the present technology achieve insertion delays less 50 pS, or less than 40 pS, for accessible technology nodes which is substantially faster than comparable clocked storage elements implemented in the same 5 nm technology.

FIG. 7 is a transistor schematic diagram of a clocked storage element like that of FIG. 2. In this example, the input D is applied through inverter 700 to the input data node for signal D0. Also, the output Q is driven by the output inverter 710, which receives as input the second latch output data signal D2. Other types of circuitry can be used to buffer the inputs and outputs of the clocked storage element of FIG. 7.

The embodiment shown in FIG. 7 includes a first transistor stack 701 (like 111A), a second transistor stack 702 (like 111B), a third transistor stack 703 (like 110A) and a fourth transistor stack 704 (like 110B). A transistor stack as the term is used herein includes a pull-up circuit path between a VDD supply line and an output data node, and a pull-down circuit path between the same output data node and a VSS supply line.

The first transistor stack 701 is like the third transistor stack 403 of FIG. 4, and the transistors have the same labels. The second transistor stack 702 is like the fourth transistor stack 404 of FIG. 4, and the transistors have the same labels. The third transistor stack 703 is like the first transistor stack 401 of FIG. 4, and the transistors have the same labels. The fourth transistor stack 704 is like the second transistor stack 402 of FIG. 4, and the transistors have the same labels.

In the illustrated embodiment, the first transistor stack 701 implements a function (D0 OR CLK) NAND FB1, as illustrated in FIG. 2.

In the illustrated embodiment, the second transistor stack 702 implements a function (D1 NAND CLK), as illustrated in FIG. 2.

In the illustrated embodiment, the third transistor stack 703 implements a function (D1 AND CLK) NOR FB2, as illustrated in FIG. 2.

In the illustrated embodiment, the fourth transistor stack 704 implements a function (D2 NOR CLK), as illustrated in FIG. 2.

Figure 8:
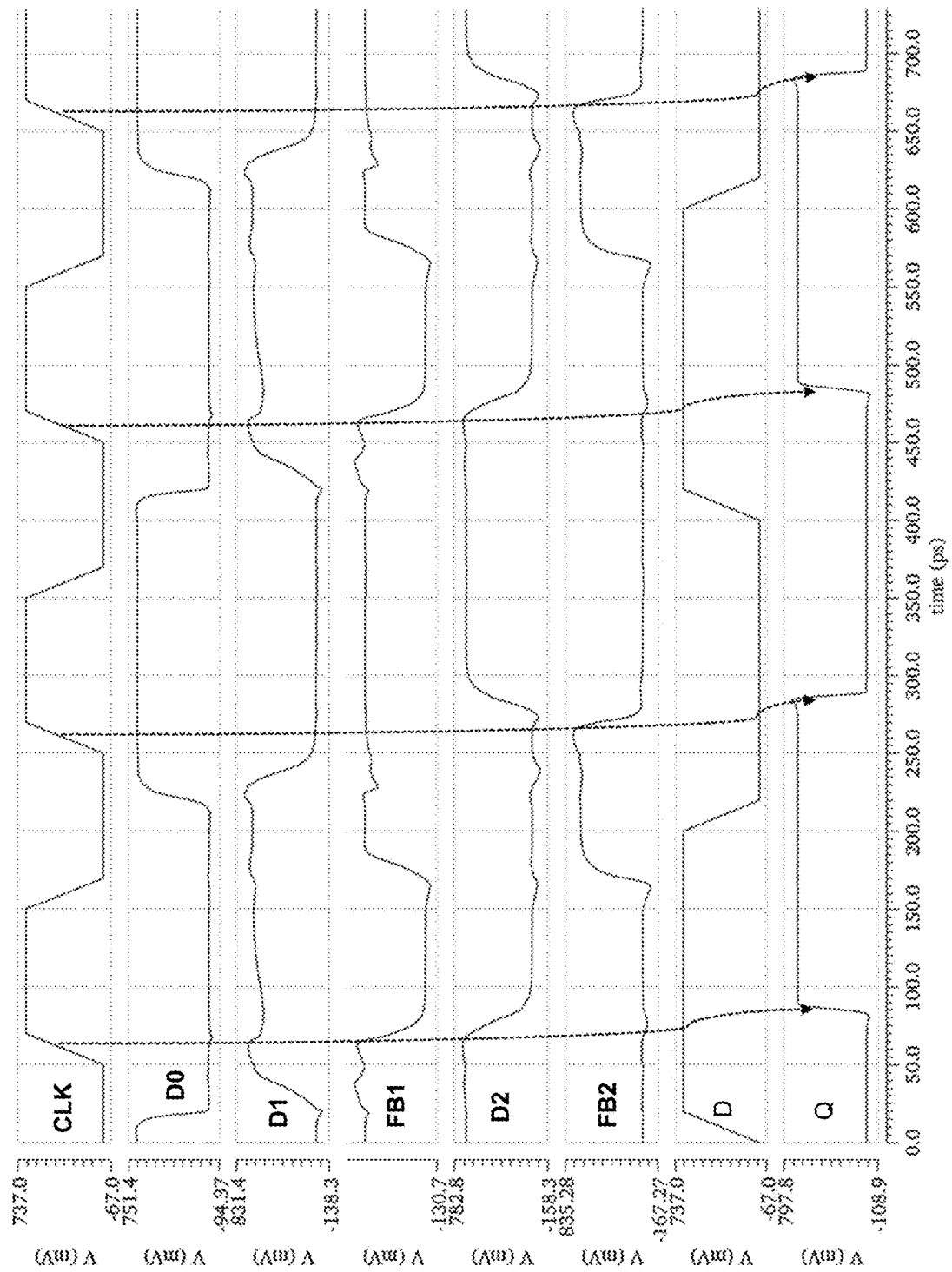
FIG. 8 is a timing diagram for operation of the circuit of FIG. 7.

The operation of the stacks is not described again. However, FIG. 8 is a timing diagram showing operation of the clocked storage element of FIG. 7, based on simulations assuming a 5 nm manufacturing node, like the simulation used to produce FIG. 5.

This disclosure describes various embodiments of a clocked storage element where signal from the input D to the output Q, traverses a two logic blocks, each of which is implemented using a single transistor stack. Further, two possible configurations are selected in such a way that the complementary clock signals are selected. This allows for achieving a Master-Slave function without the need to invert the clock signal, as commonly implemented.

The data insertion point, and the feedback logic, are selected in a way which is implementable as a single logic block. This process is applied in both latch structures: OR-NAND and AND-NOR.

The selection of the logic blocks is made so that they do not to contain more than two PMOS or two NMOS transistors in the path to the supply voltage VDD or VSS (ground). This is the minimal transistor stack necessary to implement the given function.

In deep sub-micron technology, such as 7nm and 5nm technology nodes, the resistance of the PMOS transistor is roughly equivalent to the resistance of the NMOS transistor of the same sizes, when in the saturation. This fact is used to the advantage in generating the logic structure employed in both latch structures, as the new technology does not favor NMOS transistor path over PMOS any longer.

In further transistor embodiments of the clocked storage element, it is observed that the PMOS transistors connected to the clock signal can be combined to form a single transistor and shared between the two latches (the third p-channel transistor P3 in the first transistor stack 401, and the sixth p-channel transistor P6 in the third transistor stack 403). This combined PMOS transistor (P3/P6) is made larger, and both effectively shortens the path to power supply and reduces the number of transistors. This provides an embodiment of the clocked storage element consisting of 19 transistors, thus contributing to the small size of the clocked storage element.

The size of the clocked storage element is roughly proportional to the number of transistors used to build the clocked storage element. Therefore, minimizing the number of transistors does impact the area in a beneficial way. The speed of the clocked storage element, or the amount of time taken from the cycle is equal to the time the signal takes from entering the latch to the time exiting the latch, i.e., D-Q delay. This is described in the equation: $T_m = T \geq D_{Lmax} + D_{DQmax}$ which states that the fastest the system can run (the highest frequency) is determined by the maximal delay of the signal in the logic critical path and maximal delay of the signal through the clocked storage element. Consequently, the objective in designing the clocked storage element is so that Data-to-Output (Q), D-Q, delay is smallest. This objective will be achieved if, among other criteria, there is the most direct path from the input D to the output Q. By "most direct path" we understand the smallest number of transistor stacks implementing the logic, or complex logic gates, be traversed, and that those transistor stacks are of the least complexity if possible. The third objective of the lowest power consumption is usually achieved if the number of active components is minimized. There are also other factors, such as switching activity of the nodes, charging, and discharging of the nodes etc., that do affect power consumption.

Providing the logic equivalent of the clocked storage element as a library function, as opposed to transistor diagram, consisting of the logic blocks supplied by a standard cell library, allows for the use of logic synthesis (CAD tools) in creating described clocked storage element. The cell library can be applied by electronic design automation tools in the implementation of an integrated circuit.

An integrated circuit on a single chip, can include both a rising edge clocked storage element (FIGS. 1 and 4) and a falling edge clocked storage element (FIGS. 2 and 7) implemented as described herein, which have clock signals with the same polarity applied to the corresponding clock input nodes.

The circuit of FIGS. 4 and 7, and other embodiments of the present technology can be embodied in a computer readable form using a hardware description language such as Verilog and VHDL, and stored in non-transitory data storage medium or media, and used for example as an entry in a cell library. Embodiments can include a latch with the first circuit configuration and a latch with the second circuit configuration, as independently placeable circuit elements in the cell library. A design tool can be configured to place and route the first and second circuit configurations as master or as slave as desired for a particular use of the clocked storage element. Also, this independent placement ability enables placement of the first and second latches of a clocked storage element according to placements of the source or producer of the input data (D) and the destination or consumer of the output data (Q), which placements may not be adjacent in some situations. Thus, an embodiment is provided in which the first latch comprises a circuit cell in a cell library and the second latch comprises a second circuit cell in a cell library, and the first latch and second latch are placed as separate cells by a place and route tool.

The use of the logic synthesis allows for automatic optimal transistor sizing of transistors used in the standard cell libraries to achieve the fastest D-Q path of described clocked storage element, or lowest power consumption, or both depending on the design point.

The use of the logic synthesis allows for separating the first and second latches (i.e., Master and Slave logic blocks) and placing them in the most appropriate places on the chip, which is determined by the Place and Route (PnR) Computer Aided Design (CAD) tools. This ability to separately place the first and second latches achieving the optimal PnR solution.

The Data input inverter can be replaced with another functional block, combining the latching function with the logic function, thus enhancing the utilization of the clocked storage element. In the example shown in FIG. 3, block 310 represents multiplexer function which is commonly used in conjunction with the latch.

VDD and VSS are voltages on upper and lower supply voltage lines in the circuit, referred to herein as a VDD supply line and VSS supply line, respectively. Typically, VDD is a positive voltage and VSS is ground. VSS is any voltage less than VDD. In some cases, VSS may be a negative voltage. The letters DD and SS are used for historical reasons and do not imply that the supply lines are connected to the drain or source. For example, in the circuit of FIG. 4, VDD is the voltage on the VDD supply line connected to the sources of p-channel transistors.

While the present technology is disclosed by reference to various embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A clocked storage element comprising:
   a first latch having a first latch input data node, a first clock input node and a first latch output data node, the first latch comprising a first transistor directly connected to the first latch output data node with a first gate of the first transistor directly driven by the first latch input data node; and
   a second latch having a second latch input data node connected to the first latch output data node, a second clock input node and a second latch output data node, the second latch comprising a second transistor directly connected to the second latch output data node with a second gate of the second transistor directly driven by the second latch input data node;

wherein (the first latch comprises a merged AND-NOR configured transistor stack with a NOR transistor stack configured as feedback, and the second latch comprises a merged OR-NAND configured transistor stack with a NAND transistor stack configured as feedback) or (the first latch comprises the merged OR-NAND configured transistor stack with the NAND transistor stack configured as feedback, and the second latch comprises the merged AND-NOR configured transistor stack with the NOR transistor stack configured as feedback).

2. The clocked storage element of claim 1, further comprising:
a first clocked feedback path for the first latch; and
a second clocked feedback path for the second latch.

3. The clocked storage element of claim 1, wherein a total delay from the first latch input data node to the second latch output data node is no greater than four signal passes.

4. The clocked storage element of claim 3, wherein the no greater than four signal passes include:
a signal pass through two p-channel transistors to pull up the first latch output data node and a signal pass through two n-channel transistors to pull down the second latch output data node for a first state transition; and
a signal pass through two n-channel transistors to pull down the first latch output data node and a signal pass through two p-channel transistors to pull up the second latch output data node for a second state transition.

5. The clocked storage element of claim 1, having an input buffer receiving a signal D applying a signal to the first latch input data node, and an output buffer connected to the second latch output data node and applying an output signal Q.

6. The clocked storage element of claim 1, wherein the first clock input node and the second clock input node are configured to receive clock signals having the same polarity.

7. The clocked storage element of claim 1, further comprising:
a first clocked pull-up current path consisting of two p-channel transistors between the first latch output data node and a VDD supply line and a first clocked pull-down current path consisting of two n-channel transistors between the first latch output data node and a VSS supply line; and
a second clocked pull-up current path consisting of two p-channel transistors between the second latch output data node and the VDD supply line, and a second clocked pull-down current path consisting of two n-channel transistors between the second latch output data node and a VSS supply line.

8. The clocked storage element of claim 7, further comprising:
a clocked feedback path from second latch output data node to gates of both an n-channel transistor and a p-channel transistor of the second latch.

9. The clocked storage element of claim 7, comprising no more than 19 transistors, wherein the first clocked pull-up current path and the second clocked pull-up current path share a p-channel transistor having a gate connected to the first clock input node or the second clock input node, and the clocked storage element.

10. The clocked storage element of claim 1, wherein the first latch comprises the merged AND-NOR configured transistor stack with the NOR transistor stack configured as feedback, and the second latch comprises the merged OR-NAND configured transistor stack with the NAND transistor stack configured as feedback;

wherein clocked storage element comprises a falling-edge triggered flip-flop.

11. The clocked storage element of claim 1, wherein the first latch comprises the merged OR-NAND configured transistor stack with the NAND transistor stack configured as feedback, and the second latch comprises the merged AND-NOR configured transistor stack with the NOR transistor stack configured as feedback;
wherein clocked storage element comprises a rising-edge triggered flip-flop.

12. An article of manufacture comprising a machine readable, non-transitory data storage medium having stored thereon information for use by an electronic design automation tool in an implementation of an integrated circuit, the information comprising:
a first library cell for a first latch having a first latch input data node, a first clock input node and a first latch output data node, the first latch comprising a first transistor directly connected to the first latch output data node with a first gate of the first transistor directly driven by the first latch input data node; and
a second library cell for a second latch having a second latch input data node, a second clock input node, and a second latch output data node, the second latch comprising a second transistor directly connected to the second latch output data node with a second gate of the second transistor directly driven by the second latch input data node;
wherein the first library cell and the second library cell are independently placeable in the electronic design automation tool to create a master-slave clocked storage element with the first latch output data node directly connected to the second latch input data node.

13. The article of manufacture of claim 12, wherein the first latch and the second latch are configured to receive clock signals having the same polarity at the first clock input node and the second clock input node, respectively.

14. The article of manufacture of claim 12, wherein the first latch includes a first clocked feedback path and the second latch includes a second clocked feedback path.

15. The article of manufacture of claim 12, the information further comprising:
a hardware description of a falling-edge triggered clocked storage element consisting of a first instance of the first library cell and a first instance of the second library cell, the falling-edge triggered clocked storage element including:
a first input coupled to the first latch input data node of the first instance of the first library cell, and
a first output coupled to the second latch output data node of the first instance of the second library cell, with
the first latch output data node of the first instance of the first library cell connected to the second latch input data node of the first instance of the second library cell; and
a hardware description of a rising-edge triggered clocked storage element consisting of a second instance of the first library cell and a second instance of the second library cell, the rising-edge triggered clocked storage element including:
a second input coupled to the second latch input data node of the second instance of the second library cell, and
a second output coupled to the first latch output data node of the second instance of the first library cell, with the second latch output data node of the second instance of the second library cell connected to the first latch input data node of the second instance of the first library cell.

16. The article of manufacture of claim 15, wherein the first and second instance of the first library cell and the first and second instance of the second library cell are all independently placeable.

17. An integrated circuit comprising a clocked storage element, the clocked storage element comprising:
- a first latch having a first latch input data node, a clock input node and a first latch output data node, the first latch comprising a first transistor directly connected to the first latch output data node with a first gate of the first transistor directly driven by the first latch input data node; and
- a second latch having a second latch input data node connected to the first latch output data node, a second clock input node and a second latch output data node, the second latch comprising a second transistor directly connected to the second latch output data node with a second gate of the second transistor directly driven by the second latch input data node;
- wherein (the first latch comprises a merged AND-NOR configured transistor stack with a NOR transistor stack configured as feedback, and the second latch comprises a merged OR-NAND configured transistor stack with a NAND transistor stack configured as feedback) or
- (the first latch comprises the merged OR-NAND configured transistor stack with the NAND transistor stack configured as feedback, and the second latch comprises the merged AND-NOR configured transistor stack with the NOR transistor stack configured as feedback).

18. The integrated circuit of claim 17, the clocked storage element further comprising:
- a first clocked pull-up current path consisting of two p-channel transistors between the first latch output data node and a VDD supply line and a first clocked pull-down current path consisting of two n-channel transistors between the first latch output data node and a VSS supply line;
- a second clocked pull-up current path consisting of two p-channel transistors between the second latch output data node and the VDD supply line, and a second clocked pull-down current path consisting of two n-channel transistors between the second latch output data node and a VSS supply line; and
- a clocked feedback path from second latch output data node to gates of both an n-channel transistor and a p-channel transistor of the second latch.

19. The integrated circuit of claim 17, wherein the first latch comprises the merged AND-NOR configured transistor stack with the NOR transistor stack configured as feedback, and the second latch comprises the merged OR-NAND configured transistor stack with the NAND transistor stack configured as feedback;
wherein clocked storage element comprises a falling-edge triggered flip-flop.

20. The integrated circuit of claim 17, wherein the first latch comprises the merged OR-NAND configured transistor stack with the NAND transistor stack configured as feedback, and the second latch comprises the merged AND-NOR configured transistor stack with the NOR transistor stack configured as feedback;
wherein clocked storage element comprises a rising-edge triggered flip-flop.

* * * * *